United States Patent
Cheng et al.

(10) Patent No.: US 7,355,487 B2
(45) Date of Patent: Apr. 8, 2008

(54) METHOD FOR REDUCING PHASE LOCK TIME AND JITTERING AND PHASE LOCK LOOP USING THE SAME

(75) Inventors: Chiu-Hung Cheng, Hsinchu (TW); Chih-Jen Yen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 112 days.

(21) Appl. No.: 11/307,882

(22) Filed: Feb. 27, 2006

(65) Prior Publication Data

US 2007/0120610 A1  May 31, 2007

(30) Foreign Application Priority Data

Nov. 25, 2005  (TW) .............................. 94141421 A

(51) Int. Cl.
*H03L 7/06* (2006.01)
(52) U.S. Cl. .................. 331/16; 331/17; 324/76.53
(58) Field of Classification Search ............ 331/16, 331/17, 44; 327/157; 324/76.53
See application file for complete search history.

(56) References Cited

U.S. PATENT DOCUMENTS 6,922,047 B2 *  7/2005  Knoll et al. ............. 324/76.53

\* cited by examiner

*Primary Examiner*—Joseph Chang
(74) *Attorney, Agent, or Firm*—Jianq Chyun IP Office

(57) ABSTRACT

A method for reducing phase lock time and jittering and a phase lock loop (PLL) using the same adapted for PLL including a charge pump (CP) which includes a pull-up and a pull-down networks used for controlling output voltage of the CP. The output voltage is used for controlling frequency and phase of an output signal of the PLL. The method includes: receiving a reference and a feedback signals; setting the driving capabilities of the pull-up and the pull-down networks to a first driving capability when the phase difference between the reference and the feedback signals is greater than a predetermined value; setting the driving capabilities of the pull-up and the pull-down networks to a second driving capability when the phase difference between the reference and the feedback signals is smaller than the predetermined value, wherein the first driving capability is greater than the second driving capability.

19 Claims, 7 Drawing Sheets

METHOD FOR REDUCING PHASE LOCK TIME AND JITTERING AND PHASE LOCK LOOP USING THE SAME

CROSS-REFERENCE TO RELATED APPLICATION

This application claims the priority benefit of Taiwan application serial no. 94141421, filed on Nov. 25, 2005. All disclosure of the Taiwan application is incorporated herein by reference.

BACKGROUND OF THE INVENTION

1. Field of Invention

The present invention relates to a phase lock loop. More particularly, the present invention relates to a method for reducing phase lock time and jittering of a phase lock loop and a phase lock loop using the same.

2. Description of Related Art

The research and development of phase lock loops (PLL) has started a long time and it is still the focus of today's research because of PLL's widespread application and high development potential. Wherein, there are many advantages of PLL being improved or upgraded continuously, such as the increased frequency, improved stability, expanded frequency range, and reduced lock time etc.

To be brief, the basic function of a phase lock loop is to drive a device of variable frequency using an oscillator with very low frequency variation as basic reference through the feedback function of a close loop control system, so as to keep the device having the same phase with the oscillator quickly and constantly, i.e. phase locked.

FIG. 1A illustrates the structure of a conventional phase lock loop, which includes five sub circuit systems: a phase frequency detector PFD, a charge pump CP, a loop filter LF, a voltage controlled oscillator VCO, and a frequency divider FD. The phase frequency detector PFD is used for detecting the difference between a reference signal REF and a frequency-dividing signal DS, and converts the comparison result into two digital signals to respectively output a pull-up signal DH and a pull-down signal DL. The charge pump CP is used for converting the two digital signals into a control voltage and outputting the control voltage. The loop filter LF can filter the high frequency portion of the control voltage. The voltage controlled oscillator VCO converts the control voltage into an oscillation signal VO and outputs the oscillation signal VO. The frequency divider FD lowers the frequency and sends it back to the phase frequency detector PFD to be compared with the reference signal REF.

FIG. 1B is a detailed circuit diagram of the charge pump CP. Referring to FIG. 1B, the circuit includes a capacitor C, a pull-up current source Iup, a pull-down current source Idn, a pull-up switch Sup and a pull-down switch Sdn. When the output phase lags, the pull-up switch Sup is on, the pull-down switch Sdn is off, the pull-up current source Iup charges the capacitor C to raise the output voltage VO, and the output voltage VO is sent to the voltage controlled oscillator VCO after being filtered by the loop filter LF, so as to increase the oscillation frequency of the voltage controlled oscillator VCO.

When a phase lock loop of quick phase locking function is to be designed, the driving capabilities of the pull-up current source Iup and the pull-down current source Idn of the charge pump CP as shown in FIG. 1B are to be increased; that is, the driving currents of the two current sources are to be increased. Accordingly, the charge/discharge rate of the charge pump CP to the capacitor is increased. Thus, at re-starting, the voltage sent by the charge pump CP to the voltage controlled oscillator VCO raises quickly; accordingly the frequency raises quickly, so as to lock phase quickly.

However, this design has a major defect. The frequency may exceed the originally designed frequency when increasing quickly, and when it is sent back to the phase frequency detector PFD through the frequency divider FD, the phase frequency detector PFD outputs a signal to turn on the pull-down switch Sdn in the charge pump CP to discharge the capacitor C. The driving capability of the pull-down current source Idn is increased and extra current is pulled down, so that the capacitor C is discharged too fast, the output voltage is too low, and the frequency therefore decreases too much. As it continues, frequency jittering will occur, which extends the phase lock time, or even blocks the phase and frequency to be locked.

SUMMARY OF THE INVENTION

Accordingly, the present invention is directed to provide a phase lock loop for locking phase quickly.

According to another aspect of the present invention, a method for reducing phase lock time and jittering is provided to reduce jittering of a phase lock loop.

The present invention provides a phase lock loop including a phase frequency detector, a discriminator, a charge pump, a voltage controlled oscillator, and a frequency divider. The charge pump further includes a pull-up network and a pull-down network. The phase frequency detector receives a frequency-dividing signal and an input reference signal, and outputs a phase difference signal after comparing the frequency-dividing signal and the input reference signal. The discriminator is used for receiving the phase difference signal, determines the phase difference between the frequency-dividing signal and the input reference signal, and outputs a discrimination signal when the phase difference is greater than a predetermined value. The charge pump receives the phase difference signal and the discrimination signal for outputting a voltage signal according to the phase difference signal and the discrimination signal. The pull-up network is used for increasing the voltage signal, and the pull-down network is used for reducing the voltage signal. The voltage controlled oscillator receives the voltage signal for outputting an oscillation signal according to the voltage signal. The frequency divider frequency-divides the oscillation signal and outputs the result as a frequency-dividing signal.

The present invention provides a method for reducing phase lock time of a phase lock loop. The phase lock loop includes a charge pump. The charge pump includes a pull-up network and a pull-down network for controlling an output voltage of the charge pump, and the output voltage is used for controlling the output frequency and output phase of the phase lock loop. The method includes: receiving a reference signal and a feedback signal; setting the driving capabilities of the pull-up network and the pull-down network to a first predetermined driving capability when the phase difference between the reference signal and the feedback signal is greater than a predetermined value; setting the driving capabilities of the pull-up network and the pull-down network to a second predetermined driving capability when the phase difference between the reference signal and the feedback signal is smaller than the predetermined value, wherein the first predetermined driving capability is greater than the second predetermined driving capability.

In the present invention, a discriminator is used for determining the phase difference between the reference signal and the frequency-dividing signal, so as to determine whether to increase or reduce the current driving capability of the charge pump, so that both purposes of locking phase quickly and reducing jittering can be achieved.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
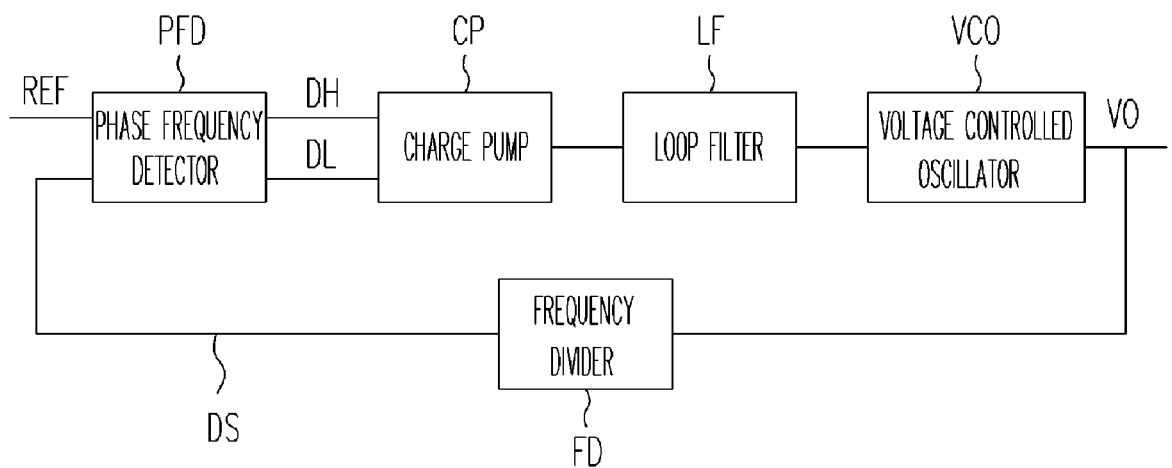
FIG. 1A is a block diagram illustrating the circuit of a conventional phase lock loop.
Figure 1B:
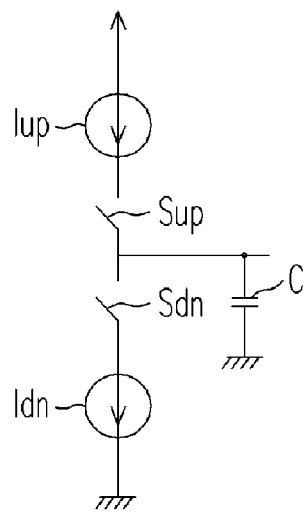
FIG. 1B is a circuit diagram of a conventional charge pump in a phase lock loop.
Figure 2:
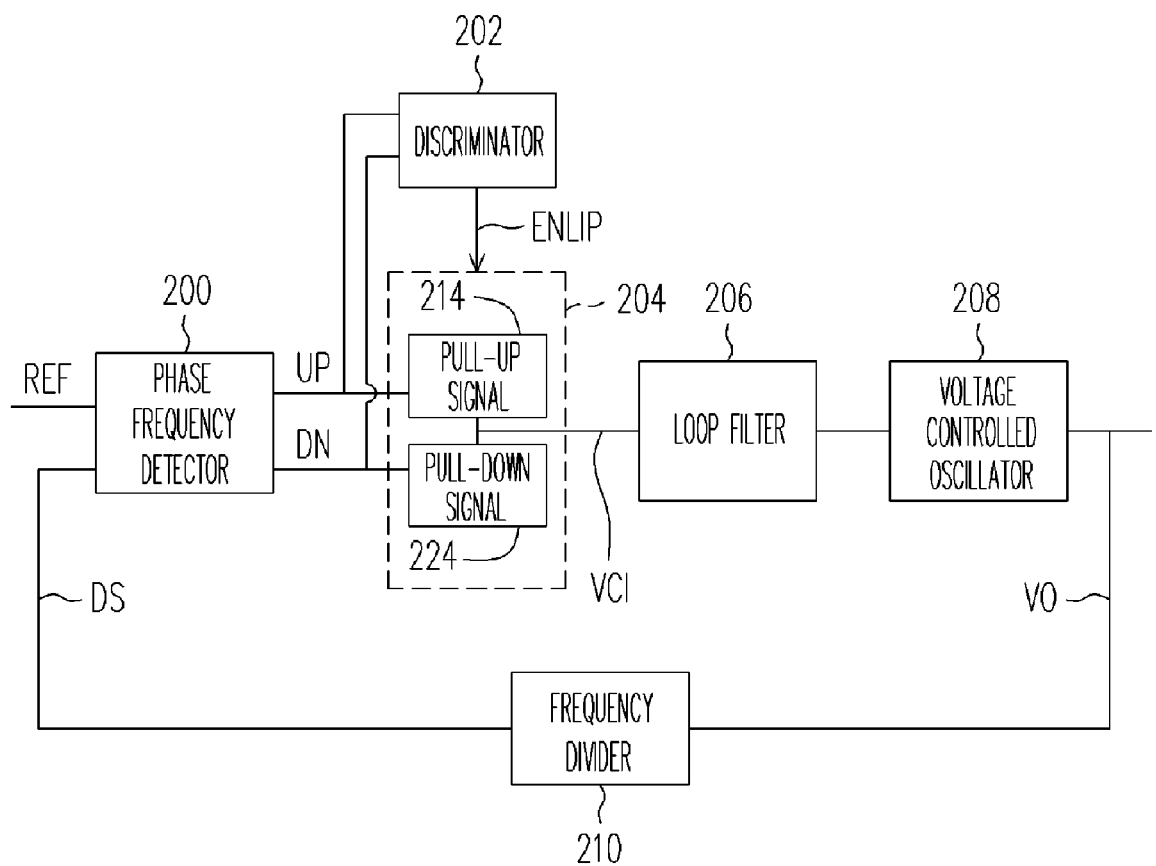
FIG. 2 is a block diagram illustrating the circuit of a phase lock loop according to an embodiment of the present invention.

FIG. 2 is a block diagram illustrating the circuit of a phase lock loop according to an embodiment of the present invention. Referring to FIG. 2, the phase lock loop includes a phase frequency detector 200, a discriminator 202, a charge pump 204, a loop filter 206, a voltage controlled oscillator 208, and a frequency divider 210. The charge pump 204 further includes a pull-up network 214 and a pull-down network 224.

The phase frequency detector 200 receives a frequency-dividing signal DS output by the frequency divider 210 and an input reference signal REF, and outputs a phase difference signal including a pull-up signal UP and a pull-down signal DN after comparing the frequency-dividing signal DS and the input reference signal REF. The pull-up signal UP and the pull-down signal DN control the pull-up network 214 and the pull-down network 224 in the charge pump 204 to control the voltage signal VCI output by the charge pump 204. Wherein, the pull-up signal is output as logic 1 and the voltage signal VCI is pulled up when the phase of the reference signal REF leads the phase of the frequency-dividing signal DS. Similarly, the pull-down signal is output as logic 1 and the voltage signal VCI is pulled down when the phase of the reference signal REF lags behind the phase of the frequency-dividing signal DS.

The voltage signal VCI is sent to the voltage controlled oscillator 208 after the high frequency noise of the voltage signal VCI has been filtered by the loop filter 206. The voltage controlled oscillator 208 determines the oscillation frequency of the output oscillation signal VO according to the volume of the voltage signal VCI. For example, the oscillation frequency of the oscillation signal VO is increased when the voltage signal VCI is increased. Similarly, the oscillation frequency of the oscillation signal VO is reduced when the voltage signal VCI is reduced. The oscillation signal VO is input into the frequency divider 210, and after frequency-dividing the oscillation signal VO, the frequency divider 210 outputs the frequency-dividing signal DS to the phase frequency detector 200, so as to complete the close loop operation.

The difference between the present embodiment of the present invention and the conventional technology is that a discriminator 202 is added to the present embodiment of the present invention. The discriminator 202, as well as the charge pump 204, receives the pull-up signal UP and the pull-down signal DN. However, the main function of the discriminator 202 is to determine the phase difference according to the pull-up signal UP and the pull-down signal DN and to output a discrimination signal ENLIP to the charge pump 204 when the phase difference reaches a predetermined value to increase the driving capabilities of the pull-up network 214 and the pull-down network 224, so as to increase or decrease the voltage signal VCI output by the charge pump quickly. Accordingly, when the phase difference is very large, the phase to be locked can be reached quickly. When the phase difference is close to the predetermined value, the original driving capabilities of the pull-up network 214 and the pull-down network 224 are restored. Accordingly, frequency jittering caused by high driving capability and great change in voltage signal VCI, which may block the phase and frequency to be locked, can be avoided when the phases are close.

Figure 3A:
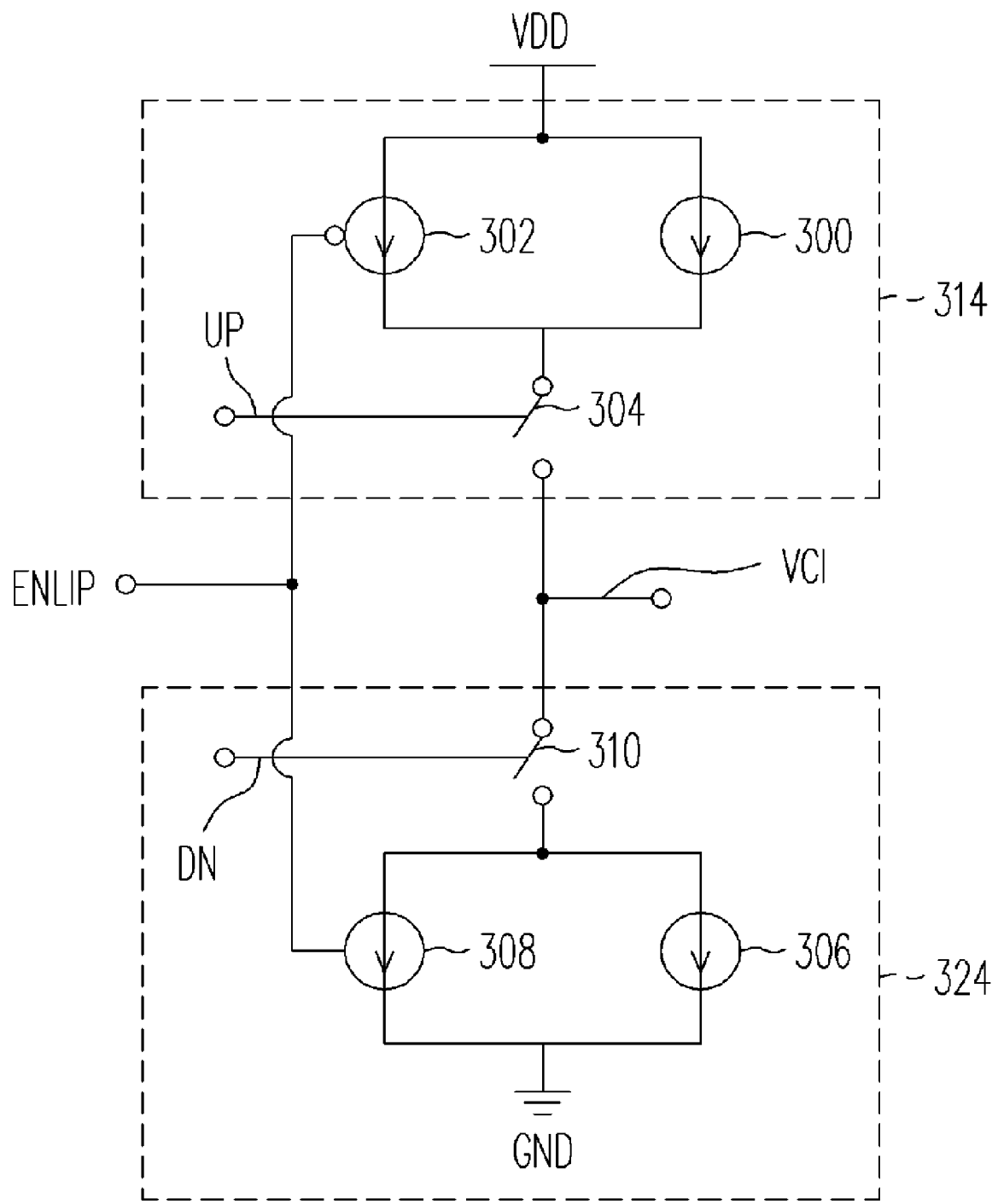
FIGS. 3A and 3B illustrate the detailed circuit of a charge pump 204 according to an embodiment of the present invention.
Figure 3B:
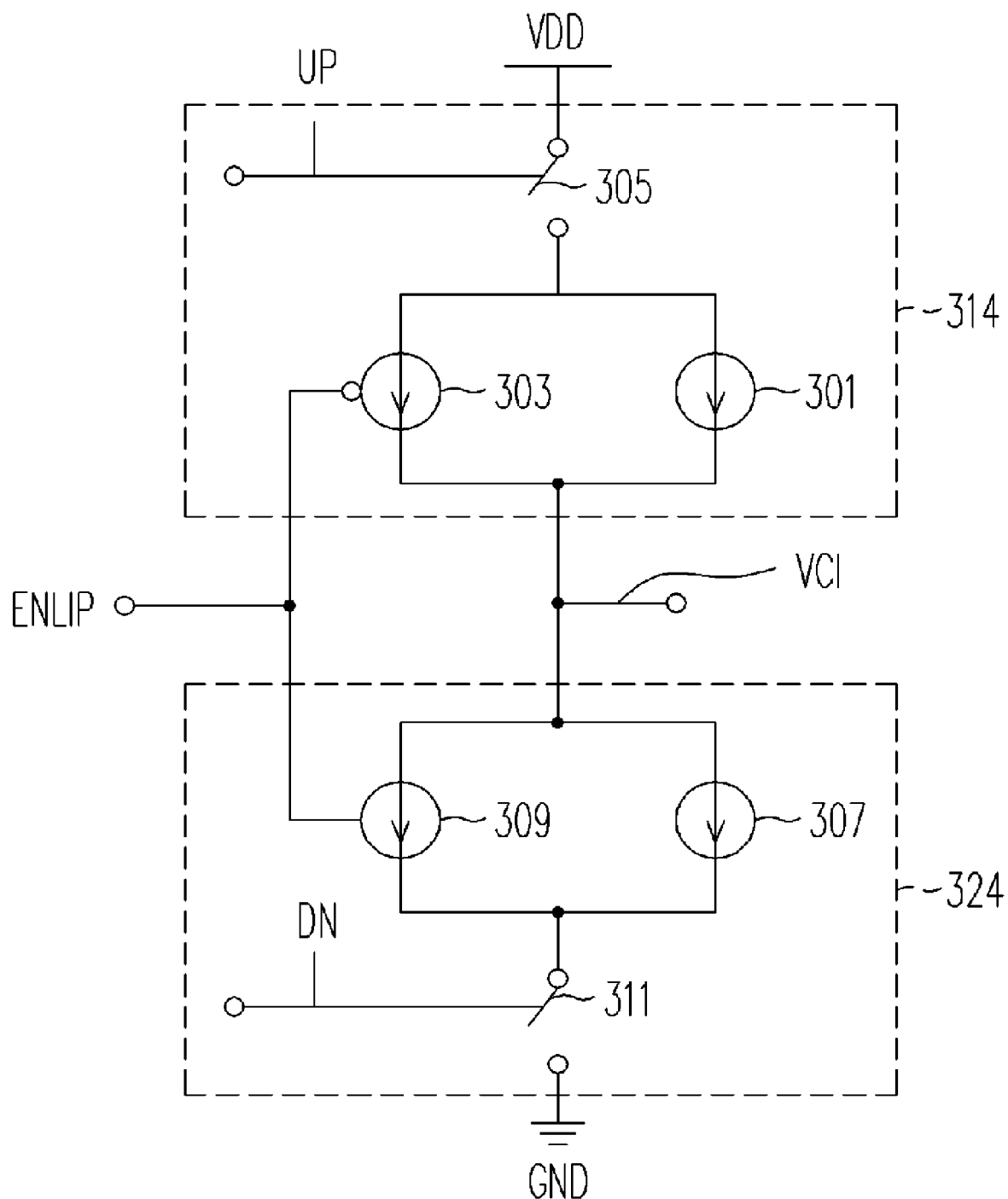

FIGS. 3A and 3B illustrate the detailed circuit of a charge pump 204 according to an embodiment of the present invention. First, referring to FIG. 3A, the pull-up network 314 and the pull-down network 324 enclosed by dashed lines are the pull-up network 214 and the pull-down network 224 shown in FIG. 2. The pull-up network 314 includes current sources 300, 302, and a switch 304. The pull-down network 324 includes current sources 306, 308, and a switch 310. When the pull-up signal UP is logic 1, switch 304 is on, the currents from the current sources 300 and 302 are output through switch 304 to pull up voltage signal VCI, so as to raise voltage signal VCI. Similarly, when the pull-down signal DN is logic 1, switch 310 is on, the currents from the current sources 306 and 308 pull down the voltage signal VCI through switch 310, so as to reduce voltage signal VCI. When current sources 302 and 308 receive the discrimination signal ENLIP, current sources 302 and 308 are turned on to increase the driving capabilities of the pull-up network and the pull-down network.

Similarly, referring to FIG. 3B, the pull-up network 314 and the pull-down network 324 enclosed by dashed lines are the pull-up network 214 and the pull-down network 224 shown in FIG. 2. The pull-up network 314 includes current sources 301, 303, and a switch 305. The pull-down network 324 includes current sources 307, 309, and a switch 311. When the pull-up signal UP is logic 1, switch 305 is on, the currents from the current sources 301 and 303 are output through switch 305 to pull up voltage signal VCI, so as to increase voltage signal VCI. Similarly, when the pull-down signal DN is logic 1, switch 311 is on, the currents from the current sources 307 and 309 pull down the voltage signal VCI through switch 311, so as to reduce voltage signal VCI. When current sources 303 and 309 receive the discrimination signal ENLIP, current sources 303 and 309 are turned on to increase the driving capabilities of the pull-up network and the pull-down network.

Moreover, FIGS. 4A~4D illustrate the detailed circuit of a discriminator 202 according to an embodiment of the present invention. Wherein, the discriminator is implemented with analog circuit in FIG. 4A and with digital circuits in FIGS. 4B~4D.

Figure 4A:
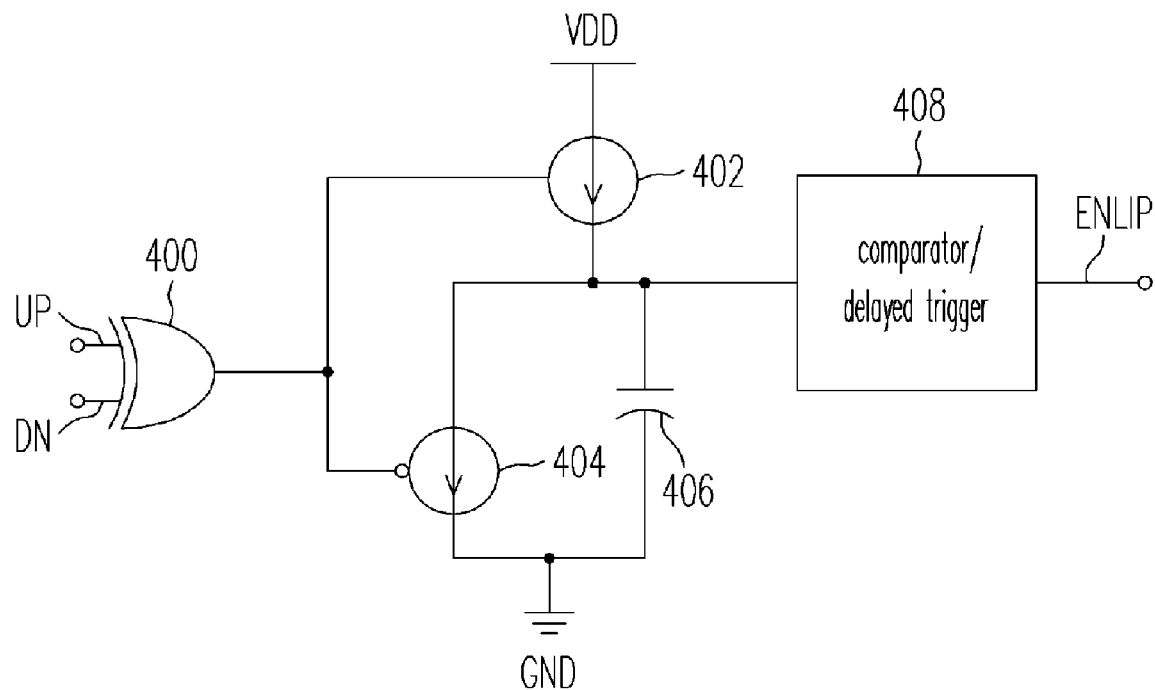
FIGS. 4A~4D illustrate the detailed circuit of a discriminator 202 according to an embodiment of the present invention.

Referring to FIG. 4A first, the discriminator includes a XOR gate 400, current sources 402 and 404, a charge storage device 406, and a comparator 408. The XOR gate 400 receives the pull-up signal UP and the pull-down signal DN and performs XOR calculation on the two signals. When one of the two signals is logic 1 and the other one is logic 0, the XOR gate 400 outputs logic 1; that is, there is a phase difference between the input reference signal REF and the feedback frequency-dividing signal DS, then the current sources 402 and 404 receive signal of logic 1. Here the current source 402 is turned on, the output current charges the charge storage device 406, and the current source 404 is turned off. When the charge storage device 406 is charged to a predetermined voltage, the comparator (or delayed trigger) 408 outputs a high voltage level (positive saturation voltage) to turn on current sources 302 and 308 in FIG. 3A or current sources 303 and 309 in FIG. 3B, so as to increase the driving capabilities of the pull-up network 214 and the pull-down network 224, and further lock the phase quickly.

When the pull-up signal UP and the pull-down signal DN are both logic 0 or logic 1, the XOR gate 400 outputs logic 0; that is, there is no phase difference between the input reference signal REF and the feedback frequency-dividing signal DS, the current source 402 is turned off, the current source 404 is turned on, so that the charge storage device 406 is discharged. When the charge storage device 406 is discharged until a particular extent, the comparator 408 outputs a low voltage level (negative saturation voltage) to turn off current sources 302 and 308 in FIG. 3A or current sources 303 and 309 in FIG. 3B, so as to reduce the driving capabilities of the pull-up network 214 and the pull-down network 224 and further avoid frequency jittering, which may block the phase and the frequency to be locked.

Figure 4B:
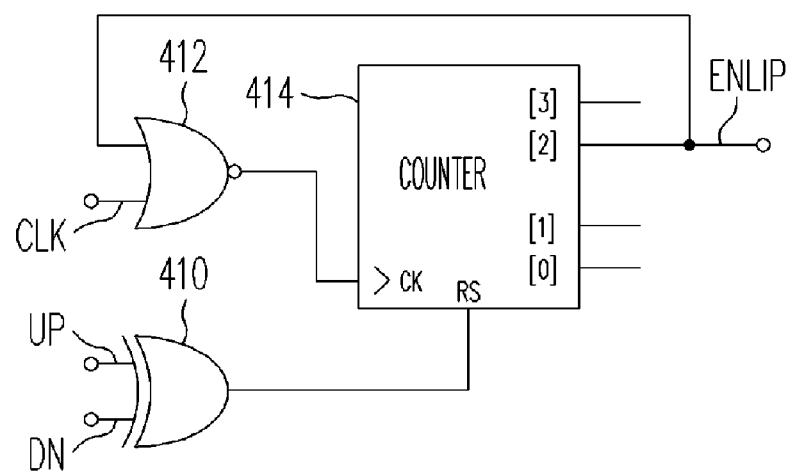

Next, referring to FIG. 4B, the discriminator includes a XOR gate 410, a NOR gate 412, and a counter 414. Similarly, the XOR gate 410 receives the pull-up signal UP and the pull-down signal DN and performs XOR calculation on the two signals. The output terminal of the XOR gate 410 is coupled to the reset terminal RS of the counter 414. The first input terminal of the NOR gate 412 receives the clock signal CLK, and the second input terminal of the NOR gate 412 is coupled to one of the outputs of the counter 414. The output terminal of the NOR gate 412 is coupled to the clock input terminal CK of the counter 414. The counter 414 in the present embodiment includes four output terminals [0], [1], [2], [3], wherein output terminal [2] is coupled to the second input terminal of the NOR gate 412.

When one of the signals is logic 1 and the other one is logic 0, the output of the XOR gate 410 is logic 1; that is, there is a phase difference between the input reference signal REF and the feedback frequency-dividing signal DS. Wherein, the reset terminal RS of the counter 414 receives signal of logic 1 and does not perform resetting. Wherein, the initial value of the output terminal [2] of the counter 414 is logic 0, so that the output of the NOR gate 412 is equal to the reversed logic of the first input terminal of the NOR gate 412, i.e. the reversed phase of the clock signal CLK. The counter 414 starts counting after the clock input terminal CK thereof has received the output of the NOR gate 412. When logic output terminals [0]=0, [1]=0, [2]=1, [3]=0, the second input terminal of the NOR gate 412 receives logic 1, wherein the NOR gate 412 outputs constant logic 0, the clock input terminal CK of the counter 414 receives logic 0 output by the NOR gate 412, so that counter 414 stops counting. The output terminal [2] of the counter 414 outputs high voltage level to turn on the current sources 302 and 308 in FIG. 3A or current sources 303 and 309 in FIG. 3B, so as to increase the driving capability of the pull-up network 214 and the pull-down network 224, and further to achieve the function of locking phase quickly.

When the pull-up signal UP and pull-down signal DN are both logic 0 or logic 1, the XOR gate 410 outputs logic 0; that is, there is no phase difference between the input reference signal REF and the feedback frequency-dividing signal DS. Since the XOR gate 410 outputs logic 0, the reset terminal of the counter 414 receives logic 0, so that the counter is reset; accordingly the output terminal [2] of the counter 414 is reset as logic 0. Since the output terminal [2] of the counter 414 is logic 0, the current sources 302 and 308 in FIG. 3A are turned off, or the current sources 303 and 309 in FIG. 3B are turned off, so as to reduce the driving capability of the pull-up network 214 and the pull-down network 224. Here the counter 414 starts counting again.

Figure 4C:
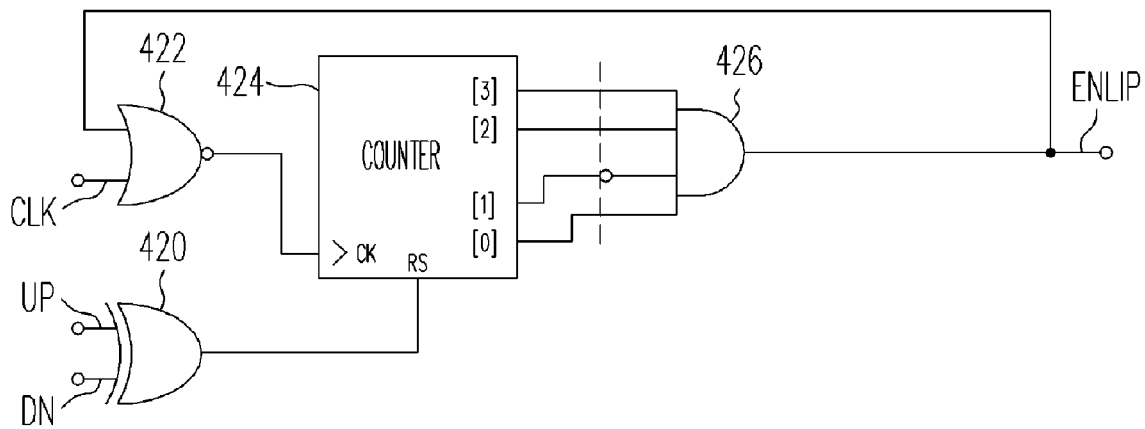

Next, referring to FIG. 4C, the discriminator includes a XOR gate 420, a NOR gate 422, a counter 424, and an AND gate 426. It can be understood by those skilled in the art that FIG. 4C is similar to FIG. 4B; however, the difference is that in FIG. 4C, the output terminals [0], [1], [2], [3] of the counter 424 are coupled to the input terminal of the AND gate 426, and the output logic of the output terminal [1] is reversed, and the output terminal of the AND gate 426 is coupled to the second input terminal of the NOR gate 422. The theory of the circuit is the same so will not be described again.

Figure 4D:
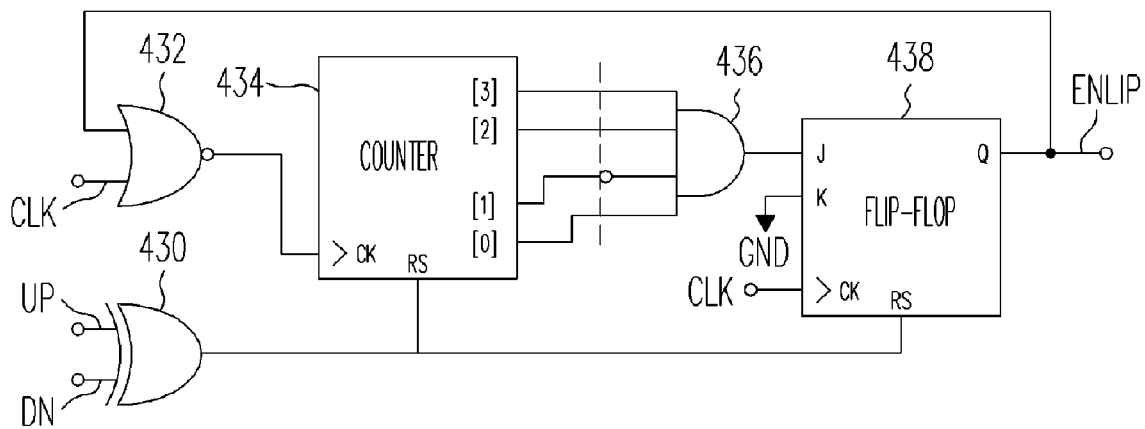

FIG. 4D is similar to FIG. 4C. The discriminator includes a XOR gate 430, a NOR gate 42, a counter 434, an AND gate 436, and a JK flip-flop 438. It can be understood by those skilled in the art that FIG. 4D is similar to FIG. 4C; however, the difference between the two circuits is that in FIG. 4D, a JK flip-flop 438 is coupled between the output of the AND gate 436 and the second input terminal of the NOR gate 422, and the output terminal of the AND gate 436 is coupled to the J input terminal of the JK flip-flop 438. The K input terminal of the JK flip-flop 438 is grounded. The reset terminal RS of the JK flip-flop 438 is coupled to the output terminal of the XOR gate 430. The output terminal of the JK flip-flop 438 is coupled to the second input terminal of the NOR gate 432. The theory of the circuit is similar to that in FIG. 4C so will not be described again.

Figure 5:
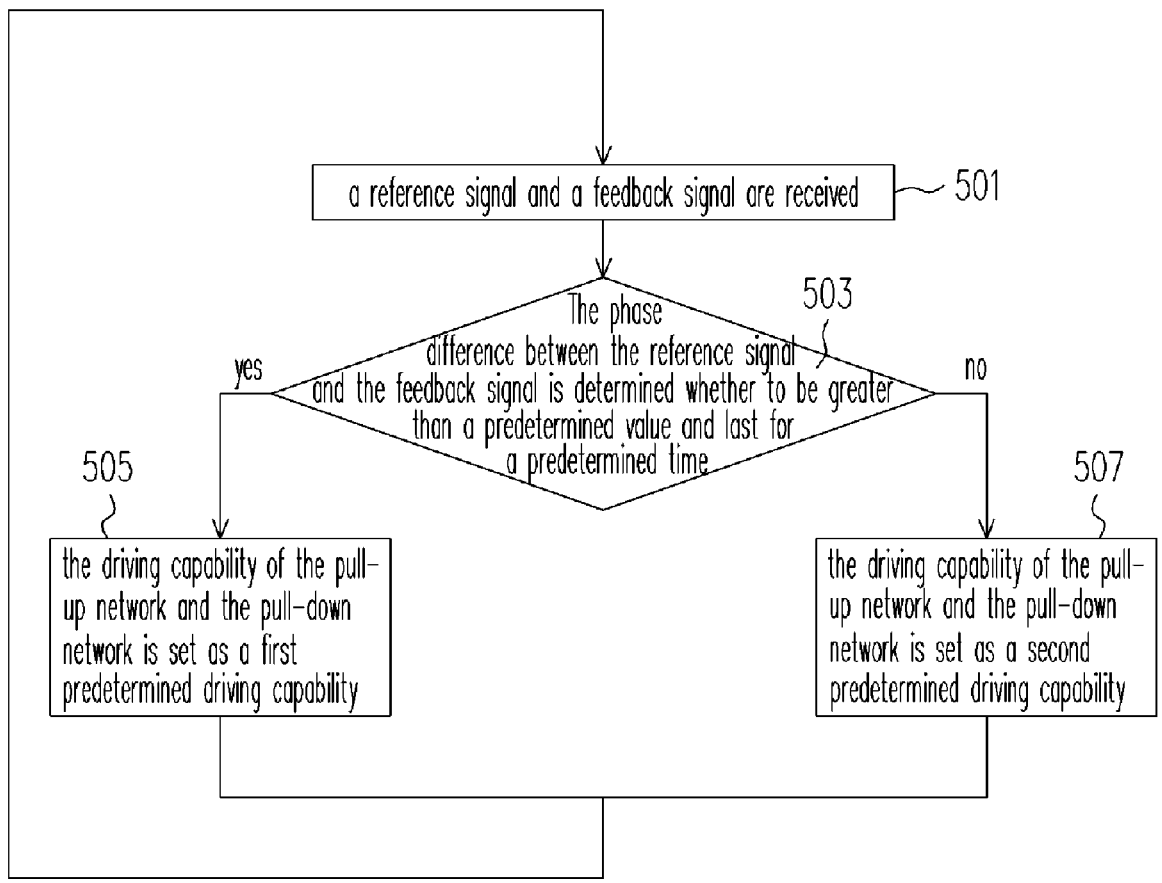
FIG. 5 is a flowchart illustrating the method for reducing phase lock time and jitter of a phase lock loop according to an embodiment of the present invention.

According to the embodiments described above, a method applicable for phase lock loops can be induced. The phase lock loop includes a charge pump. The charge pump includes a pull-up network and a pull-down network used for controlling the output voltage of the charge pump, and the output voltage is used for controlling the frequency and phase of an output signal of the phase lock loop. FIG. 5 is a flowchart illustrating the method for reducing phase lock time and jitter according to an embodiment of the present invention. Please refer to both FIG. 5 and FIG. 2. First, a reference signal REF and a feedback signal (frequency-dividing signal) DS are received (step 501). The phase difference between the reference signal REF and the feedback signal DS is determined whether to be greater than a predetermined value and last for a predetermined time (step 503). If the phase difference between the reference signal REF and the feedback signal DS is determined to be greater than the predetermined value, the driving capability of the pull-up network and the pull-down network is set as a first predetermined driving capability (step 505). Otherwise, the driving capability of the pull-up network and the pull-down network is set as a second predetermined driving capability (step 507), wherein the first predetermined driving capability is greater than the second predetermined driving capability.

In overview, in the present invention, a discriminator is used for determining the phase difference between the reference signal and the frequency-dividing signal, so as to determine whether the current driving capability of the charge pump should be increased or reduced; thus, not only the phase can be locked quickly, but jitter can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase lock loop, comprising: a phase frequency detector, receiving a frequency-dividing signal and an input reference signal, and outputting a phase difference signal after comparing the frequency-dividing signal and the input reference signal; a discriminator, receiving the phase difference signal, determining a phase difference between the frequency-dividing signal and the input reference signal, and outputting a discrimination signal when the phase difference is greater than a predetermined value; a charge pump, receiving the phase difference signal and the discrimination signal, and outputting a voltage signal according to the phase difference signal and the discrimination signal; a voltage controlled oscillator, receiving the voltage signal, and outputting an oscillation signal according to the voltage signal; and a frequency divider, used for frequency-dividing the oscillation signal and outputting the result as the frequency-dividing signal input of the phase frequency detector.

2. The phase lock loop as claimed in claim 1, wherein the charge pump comprises: a pull-up network, used for increasing the voltage signal; and a a pull-down network, used for reducing the voltage signal.

3. The phase lock loop as claimed in claim 1, further comprising a loop filter coupled between the charge pump and the voltage controlled oscillator for filtering high frequency noise of the voltage signal.

4. The phase lock loop as claimed in claim 2, wherein the pull-up network comprises: a first current source, including a first terminal and a second terminal, the first terminal of the first current source being coupled to a first voltage level; a second current source, including a first terminal, a second terminal, and a control terminal, the first terminal of the second current source being coupled to the first voltage level, the control terminal of the second current source receiving the discrimination signal; and a first switch, including a first terminal, a second terminal, and a control terminal, the first terminal of the first switch being coupled to the second terminal of the first current source and the second terminal of the second current source, the second terminal of the first switch being coupled to the pull-down network.

5. The phase lock loop as claimed in claim 2, wherein the pull-down network comprises: a third current source, including a first terminal and a second terminal, the second terminal of the third current source being coupled to a second voltage level; a fourth current source, including a first terminal, a second terminal, and a control terminal, the second terminal of the fourth current source being coupled to the second voltage level, the control terminal of the fourth current source receiving the discrimination signal; and a second switch, including a first terminal, a second terminal, and a control terminal, the first terminal of the second switch being coupled to the first terminal of the third current source and the first terminal of the fourth current source, the second terminal of the second switch being coupled to the pull-up network.

6. The phase lock loop as claimed in claim 2, wherein the phase difference signal includes a pull-up signal and a pull-down signal, the pull-up signal being sent to the pull-up network and the pull-down signal being sent to the pull-down network, for controlling current of the pull-up network and the pull-down network.

7. The phase lock loop as claimed in claim 1, wherein the discriminator comprises: a XOR gate, including a first input terminal, a second input terminal, and an output terminal, the first input terminal receiving a pull-up signal, the second input terminal receiving a pull-down signal; a fifth current source, including a first terminal, a second terminal, and a control terminal, the control terminal of the fifth current source being coupled to the output terminal of the XOR gate, the first terminal of the fifth current source being coupled to a first voltage level; a sixth current source, including a first terminal, a second terminal, and a control terminal, the control terminal of the sixth current source being coupled to the output terminal of the XOR gate, the first terminal of the sixth current source being coupled to the second terminal of the fifth current source, the second terminal of the sixth current source being coupled to a second voltage level; a charge storage device, having one terminal coupled to the second terminal of the fifth current source and another terminal coupled to the second voltage level; and a comparator, including an input terminal and an output terminal, the input terminal of the comparator being coupled to the second terminal of the fifth current source, and the output terminal of the comparator outputting the discrimination signal.

8. The phase lock loop as claimed in claim 1, wherein the discriminator comprises: a XOR gate, including a first input terminal, a second input terminal, and an output terminal, the first input terminal of the XOR gate receiving a pull-up signal, the second input terminal of the XOR gate receiving a pull-down signal; a NOR gate, including a first input terminal, a second input terminal, and an output terminal, the first input terminal of the NOR gate receiving a clock signal and the second input terminal of the NOR gate receiving the discrimination signal; and a counter, including a clock input terminal, a reset terminal, and a plurality of counter output terminals, the clock input terminal of the counter being coupled to the output terminal of the NOR gate, the reset terminal of the counter being coupled to the output terminal of the XOR gate, one of the counter output terminals being coupled to the second output terminal of the NOR gate and outputting the discrimination signal.

9. The phase lock loop as claimed in claim 1, wherein the discriminator comprises: a XOR gate, including a first input terminal, a second input terminal, and an output terminal, the first input terminal of the XOR gate receiving a pull-up signal, the second input terminal of the XOR gate receiving a pull-down signal; a NOR gate, including a first input terminal, a second input terminal, and an output terminal, the first input terminal of the NOR gate receiving a clock signal, the second input terminal of the NOR gate receiving the discrimination signal; a counter, including a clock input terminal, a reset terminal, and a plurality of counter output terminals, the clock input terminal of the counter being coupled to the output terminal of the NOR gate, the reset terminal of the counter being coupled to the output terminal of the XOR gate; and a Boolean calculation unit, receiving the output signals of the counter output terminals, and outputting the discrimination signal after performing logic calculation on the received output signals.

10. The phase lock loop as claimed in claim 9, wherein the Boolean calculation unit is an AND gate used for receiving the output signals of the counter output terminals and outputting the discrimination signal after performing AND logic calculation on the received output signals.

11. The phase lock loop as claimed in claim 9, wherein the Boolean calculation unit comprises: an AND gate, used for receiving the output signals of the counter output terminals and outputting the result after performing AND logic calculation on the received output signals; and a JK flip-flop, including a first input terminal, a second input terminal, a clock input terminal, a reset terminal, and an output terminal, the first input terminal of the JK flip-flop receiving the output of the AND gate, the second input terminal of the JK flip-flop being grounded, the clock input terminal of the JK flip-flop receiving the clock signal, the reset terminal of the JK flip-flop being coupled to the output terminal of the XOR gate, the output terminal of the JK flip-flop being coupled to the second input terminal of the NOR gate.

12. The phase lock loop as claimed in claim 2, wherein the pull-up network comprises: a first switch, including a first terminal, a second terminal, and a control terminal, the first terminal of the first switch being coupled to a first voltage level; a first current source, including a first terminal and a second terminal, the first terminal of the first current source being coupled to the second terminal of the first switch; and a second current source, including a first terminal, a second terminal, and a control terminal, the first terminal of the second current source being coupled to the second terminal of the first switch, the control terminal of the second current source receiving the discrimination signal, the second terminal of the second current source being coupled to the second terminal of the first current source and the pull-down network.

13. The phase lock loop as claimed in claim 11, wherein the pull-down network comprises: ba third current source, including a first terminal and a second terminal, the first terminal of the third current source being coupled to the pull-up network; a fourth current source, including a first terminal, a second terminal, and a control terminal, the first terminal of the fourth current source being coupled to the pull-up network, the control terminal of the fourth current source receiving the discrimination signal, the second terminal of the fourth current source being coupled to the second terminal of the third current source; and a second switch, including a first terminal, a second terminal, and a control terminal, the first terminal of the second switch being coupled to the second terminal of the third current source, the second terminal of the second switch being coupled to a second voltage level.

14. A method for reducing phase lock time and jitter, applicable for a phase lock loop including a charge pump, the charge pump including a pull-up network and a pull-down network used for controlling an output voltage of the charge pump, the output voltage being used for controlling a frequency and a phase of an output signal of the phase lock loop, the method comprising: receiving a reference signal and a feedback signal; setting the driving capabilities of the pull-up network and the pull-down network as a first predetermined driving capabilities when the phase difference between the reference signal and the feedback signal is greater than a predetermined value; and setting the driving capabilities of the pull-up network and the pull-down network as a second predetermined driving capabilities when the phase difference between the reference signal and the feedback signal is smaller than the predetermined value, wherein, the first predetermined driving capability is greater than the second predetermined driving capability.

15. The method as claimed in claim 14, wherein the driving capability of the pull-up network and the pull-down network is increased when the phase difference between the reference signal and the feedback signal is greater than a predetermined value.

16. The method as claimed in claim 14, wherein the phase difference between the reference signal and the feedback signal is determined by a discriminator.

17. A method for controlling driving capability of a charge pump, the charge pump including a pull-up network and a pull-down network used for controlling an output voltage of the charge pump, each of the pull-up network and the pull-down network having at least one driving modes with different predetermined driving capacities, the method comprising:
  receiving a reference signal and a feedback signal;
  determining a phase difference between the reference signal and the feedback signal; and
  setting the charge pump to one of the driving modes according to the phase difference.

18. The method of claim 17, wherein when the phase difference is greater than a predetermined value, the charge pump is set to a first driving mode, and when the phase difference is smaller than the predetermined value, the charge pump is set to a second driving mode.

19. The method of claim 18, wherein the driving capability of the first driving mode is greater than the driving capability of the second driving mode.

* * * * *